United States Patent
Nguyen et al.

(10) Patent No.: US 12,446,173 B2
(45) Date of Patent: Oct. 14, 2025

(54) ELECTRONIC APPARATUS

(71) Applicant: SAMSUNG ELECTRONICS CO., LTD., Suwon-si (KR)

(72) Inventors: Dinh Quynh Nguyen, Pho Yen town (VN); Dac Tri Bui, Pho Yen town (VN); Xuan Truong Dao, Pho Yen town (VN); Van Hoang Nguyen, Pho Yen town (VN); Cong Khanh Pham, Pho Yen town (VN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 104 days.

(21) Appl. No.: 17/970,308

(22) Filed: Oct. 20, 2022

(65) Prior Publication Data
US 2023/0199987 A1 Jun. 22, 2023

Related U.S. Application Data

(63) Continuation of application No. PCT/KR2022/013966, filed on Sep. 19, 2022.

(30) Foreign Application Priority Data

Dec. 21, 2021 (KR) .................... 10-2021-0184237

(51) Int. Cl.
*H05K 5/00* (2025.01)
*H04M 1/02* (2006.01)
*H05K 5/02* (2006.01)

(52) U.S. Cl.
CPC ........ *H05K 5/0247* (2013.01); *H04M 1/0214* (2013.01); *H05K 5/0226* (2013.01)

(58) Field of Classification Search
None
See application file for complete search history.

(56) References Cited

U.S. PATENT DOCUMENTS 6,064,003 A * 5/2000 Moore ................ B60R 16/0222
174/152 G
8,106,312 B2 * 1/2012 Shinoda ................ H05K 5/069
174/554

(Continued)

FOREIGN PATENT DOCUMENTS

EP         4 247 133 A1    9/2023
KR   10-2017-0040082 A     4/2017

(Continued)

OTHER PUBLICATIONS

International Search Report (PCT/ISA/210) and Written Opinion (PCT/ISA/237) dated Dec. 23, 2022 issued by the International Searching Authority in International Application No. PCT/KR2022/013966.

(Continued)

*Primary Examiner* — Imani N Hayman
*Assistant Examiner* — Rashen E Morrison
(74) *Attorney, Agent, or Firm* — Sughrue Mion, PLLC

(57) ABSTRACT

An electronic apparatus includes a first housing configured to accommodate a first circuit and a first passage member for retracting a cable member, a second housing configured to accommodate a second circuit and a second passage member for retracting the cable member into the housing, a hinge structure provided between the first housing and the second housing and configured to rotatably connect the first housing and the second housing, a flexible display supported by the first housing and the second housing, and a cable member electrically connecting the first circuit and the second circuit via the first passage member, the hinge structure, and the second passage. At least one of the first passage member and the second passage member includes an elastic member including a hollow region penetrated by the cable member, (Continued)

and a bonding member filling between the cable member and the elastic member in the hollow region.

14 Claims, 13 Drawing Sheets

(56) References Cited

U.S. PATENT DOCUMENTS

| | | | |
|---|---|---|---|
| 9,854,678 B2 | 12/2017 | Song et al. | |
| 9,872,408 B2 | 1/2018 | Choi et al. | |
| 9,912,138 B2 | 3/2018 | Wee et al. | |
| 9,992,893 B2 | 6/2018 | Choi et al. | |
| 10,405,446 B2 | 9/2019 | Choi et al. | |
| 10,469,635 B1* | 11/2019 | Carlson | H04M 1/0277 |
| 10,528,086 B2* | 1/2020 | Chung | H05K 1/147 |
| 10,868,896 B2 | 12/2020 | Carlson et al. | |
| 11,191,177 B2 | 11/2021 | Choi et al. | |
| 11,457,537 B2 | 9/2022 | Lee et al. | |
| 11,528,349 B2 | 12/2022 | Kim et al. | |
| 11,956,002 B2* | 4/2024 | Cho | H05K 1/189 |
| 2002/0079653 A1* | 6/2002 | Noguchi | H05K 5/061 |
| | | | 277/628 |
| 2008/0078064 A1 | 4/2008 | Lai | |
| 2010/0118498 A1* | 5/2010 | Ren | H05K 5/069 |
| | | | 428/137 |
| 2011/0090652 A1* | 4/2011 | Wee | H02G 15/013 |
| | | | 361/749 |
| 2017/0099742 A1 | 4/2017 | Choi et al. | |
| 2018/0098446 A1 | 4/2018 | Choi et al. | |
| 2018/0249588 A1 | 8/2018 | Choi et al. | |
| 2019/0343013 A1 | 11/2019 | Choi et al. | |
| 2019/0369668 A1 | 12/2019 | Kim et al. | |
| 2020/0162596 A1* | 5/2020 | Kim | H05K 1/0393 |
| 2020/0413559 A1 | 12/2020 | Lee et al. | |
| 2022/0078937 A1 | 3/2022 | Choi et al. | |

FOREIGN PATENT DOCUMENTS

| | | |
|---|---|---|
| KR | 10-2019-0046578 A | 5/2019 |
| KR | 10-2020-0057236 A | 5/2020 |
| KR | 10-2021-0001050 A | 1/2021 |
| WO | 2014/027187 A1 | 2/2014 |

OTHER PUBLICATIONS

Extended European Search Report dated Nov. 29, 2024, issued by the European Patent Office in European Application No. 22911516.7.

* cited by examiner

ELECTRONIC APPARATUS

CROSS-REFERENCE TO RELATED APPLICATION(S)

This application is a continuation of International Application No. PCT/KR2022/013966 designating the United States, filed on Sep. 19, 2022, in the Korean Intellectual Property Receiving Office and claiming priority to Korean Patent Application No. 10-2021-0184237, filed on Dec. 21, 2021, the disclosures of which are incorporated by reference herein in their entireties

BACKGROUND

1. Field

The disclosure relates to an electronic apparatus including a structure for preventing foreign substances from entering the electronic apparatus. More particularly, the disclosure relates to an electronic apparatus including a structure for preventing a fluid from flowing into a housing.

2. Description of Related Art

Recently, a foldable electronic apparatus has been developed, which has a compact size when folded and usually provides a large screen, which increases portability. The foldable electronic apparatus includes a flexible display having a bending region.

Also, the foldable electronic apparatus has a housing supporting the flexible display, and includes a hinge structure for folding the flexible display.

Meanwhile, when a fluid flows into the housing in which electronic components are embedded through a gap between the hinge structures, there is a problem in that the electronic components are more likely to be damaged.

SUMMARY

The disclosure is to solve the problem described above, and an object of the disclosure is to provide an electronic apparatus including a structure capable of preventing foreign substances from flowing into through a passage for a flexible cable to pass in a housing of the electronic apparatus, and minimizing an impact applied to the flexible cable.

According to an aspect of the disclosure, there is provided an electronic apparatus including: a first housing configured to accommodate a first circuit, the first housing comprising a first passage member configured to retract a cable member into the first housing; a second housing configured to accommodate a second circuit, the second housing comprising a second passage member configured to retract the cable member into the second housing; a hinge structure provided between the first housing and the second housing and configured to rotatably connect the first housing and the second housing; a flexible display supported by the first housing and the second housing; and a cable member configured to electrically connect the first circuit and the second circuit via the first passage member, the hinge structure, and the second passage member in sequence, wherein at least one of the first passage member or the second passage member includes: an elastic member comprising a hollow region in which the cable member is provided; and a bonding member filled between the cable member and the elastic member in the hollow region.

The elastic member may include a first elastic member having a first groove; and a second elastic member having a second groove, wherein the first and second elastic members are configured to form the hollow region by being provided to face the first groove and the second groove.

The bonding member may include an upper region covering an upper surface of the elastic member and filling a space between an inner wall of the passage member on which the elastic member is provided and the cable member; and a lower region filling the hollow region.

The first elastic member may include a first protruding region protruding toward the cable member, wherein the second elastic member comprises a second protruding region protruding toward the cable member at a position corresponding to the first protruding region, and wherein the first protruding region and second protruding region are configured to press and fix a region of the cable member.

The cable member may include a first region retracted into the first or second passage member from the hinge structure; a second region passing through the hollow region of the elastic member; and a third region retracted into the first or second housing, wherein the second region is configured to be formed to be bent at a boundary with the first and third regions, respectively.

The second region may have an incline shape with respect to the inner wall of the first passage member or second passage member, and wherein the first groove and the second groove are configured to be formed to correspond to the inclined shape of the second region.

The first and second protruding regions may be further configured to press and fix a portion of the first region.

The first and second elastic members may include a lower support surface in contact with the third region of the cable member, and wherein the first and second elastic members are further configured to press and fix a portion of the third region.

The elastic member may be configured to be provided on the first passage member and the second passage member, respectively.

According to an aspect of the disclosure, there is provided a method of controlling an electronic apparatus including: arranging a cable member to pass through a passage member included in a housing; providing a first elastic member between a first surface of the cable member and a first surface of an inner wall of the passage member facing the first surface of the cable member; providing a second elastic member between a second surface of the cable member and a second surface of the inner wall of the passage member facing the second surface of the cable member; injecting a bonding agent into a hollow region formed by a first groove of the first elastic member and a second groove of the second elastic member; and curing the bonding agent.

The providing the first and second elastic members may include providing the first and second elastic members such that the first groove of the first elastic member and the second groove of the second elastic member form the hollow region by being provided to face each other.

The injecting the bonding agent may include applying a bonding agent to cover upper surfaces of the first and second elastic members and to fill a space between the cable member and an inner wall of the passage member.

The providing the first and second elastic members may include providing the first and second elastic members such that a first protruding area of the first elastic member protruding toward the cable member and a second protruding area of the second elastic member protruding toward the cable member at a position corresponding to the first protruding area press and fix one region of the cable member.

The injecting the bonding agent may include injecting the bonding agent into the hollow region through an injection hole formed on an upper surface of the first and second elastic members.

The curing the bonding agent may include at least one of applying heat to the injected bonding agent, irradiating ultraviolet rays, or applying pressure.

According to an aspect of the disclosure, there is provided an electronic apparatus including: a first housing configured to accommodate a first circuit; a first passage member configured to receive a cable member; a second housing configured to accommodate a second circuit; a second passage member configured to receive the cable member; a hinge structure provided between the first housing and the second housing and configured to rotatably connect the first housing and the second housing; wherein at least one of the first passage member or the second passage member includes: an elastic member comprising a hollow region in which the cable member is provided; and a bonding member filled between the cable member and the elastic member in the hollow region.

DETAILED DESCRIPTION

Figure 1:
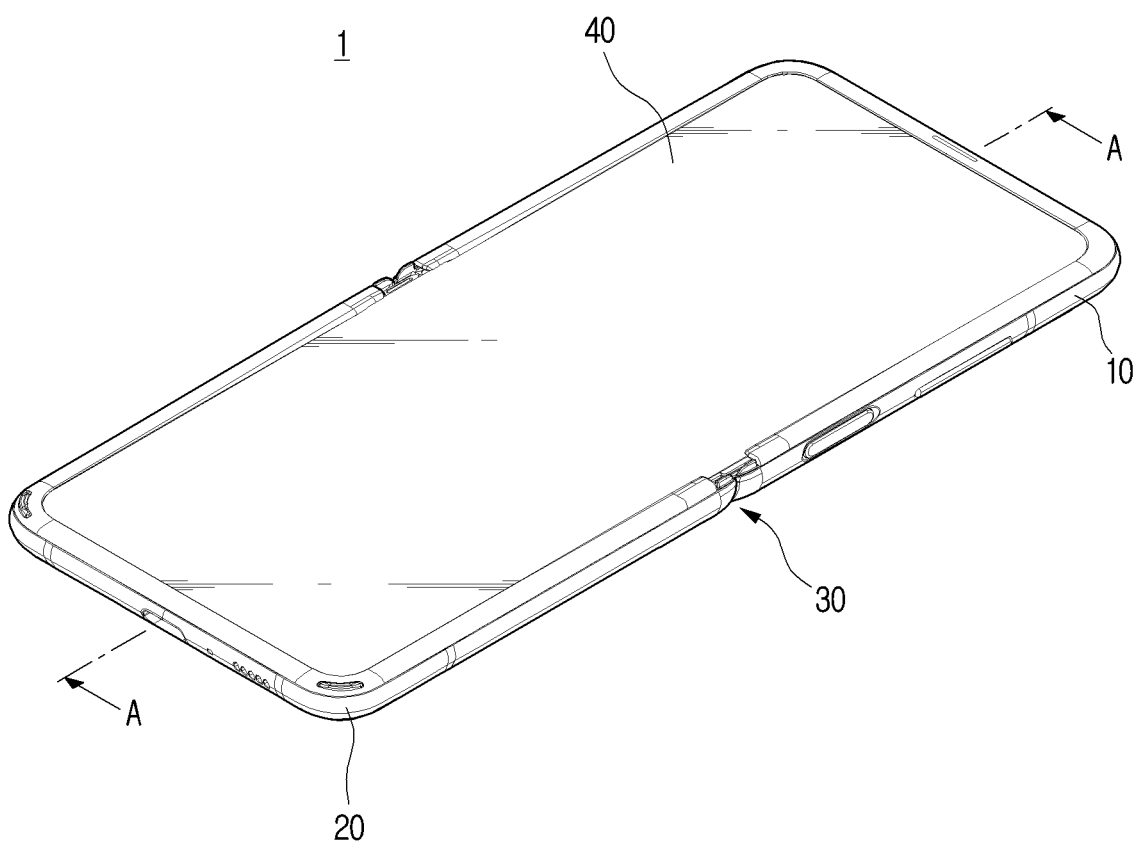
FIG. 1 is a perspective view of an electronic apparatus according to an example embodiment.

In the following description, same drawing reference numerals are used for the same elements even in different drawings. In the following description, well-known functions or constructions may not be described in detail if they would obscure the invention in unnecessary detail. Further, dimensions of various elements in the accompanying drawings may be arbitrarily selected for assisting in a comprehensive understanding.

The terms used in the disclosure and the claims may be general terms selected in consideration of the functions of the various example embodiments of the disclosure. However, such terms may vary depending on an intention of those skilled in the art, a legal or technical interpretation, an emergence of a new technology, or the like. Also, there may be some terms arbitrarily selected by an applicant. Such terms may be construed according to meanings defined in the disclosure, and may also be construed based on general contents of the disclosure and a typical technical concept in the art unless the terms are not specifically defined.

The terms "have", "may have", "include", and "may include" used in the exemplary embodiments of the disclosure indicate the presence of corresponding features (for example, elements such as numerical values, functions, operations, or parts), and do not preclude the presence of additional features.

In the disclosure, components necessary for the description of each embodiment of the disclosure are described, and thus the disclosure is not necessarily limited thereto. Accordingly, some components may be changed or omitted, and the other components may be added. In addition, they may be distributed and arranged in different independent devices.

Various example embodiments of the disclosure will be described in greater detail below with reference to the accompanying drawings and contents described in the accompanying drawings, but the disclosure is not restricted or limited by the embodiments.

An electronic apparatus according to various embodiments of the disclosure may include, for example, at least one of smartphones, a tablet personal computer (PC), a mobile phone, a video phone, an e-book reader, a desktop personal computer (PC), a laptop personal computer (PC), a net book computer, a workstation, a server, a personal digital assistant (PDA), a portable multimedia player (PMP), an MP3 player, a mobile medical device, a camera, and a wearable device. According to various embodiments, wearable devices may include at least one of accessories (e.g., watches, rings, bracelets, anklets, necklaces, glasses, contact lenses, or head-mounted-devices (HMD)), fabrics or clothing (e.g., electronic clothing), a body attachment type (e.g., a skin pad or a tattoo), or a bio-implantable circuit.

Hereinafter, various example embodiments will now be explained in detail with reference to the accompanying drawings.

Figure 2:
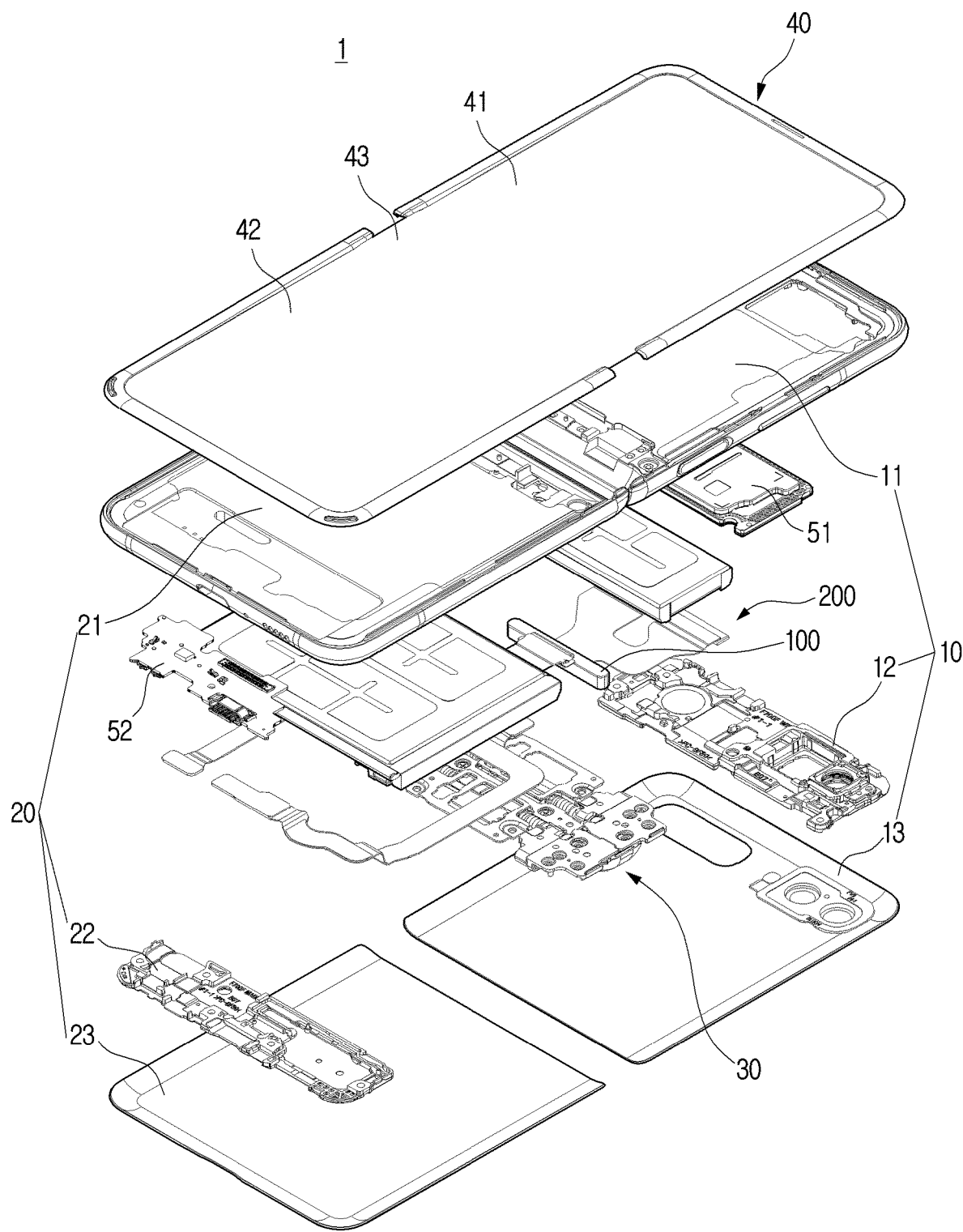
FIG. 2 is an exploded perspective view of an electronic apparatus according to an example embodiment.

FIG. 1 is a perspective view of an electronic apparatus according to an example embodiment, and FIG. 2 is an exploded perspective view of an electronic apparatus according to an example embodiment.

Referring to FIG. 1, an electronic apparatus 1 may include a first housing 10, a second housing 20, a hinge structure 30, and a flexible display 40. The first and second housings 10 and 20 may support a region of the flexible display 40, respectively, and the first and second housings 10 and 20 may be rotatable towards each other with the hinge structure 30 as an axis of rotation. In addition, the flexible display 40 may be folded or unfolded by changing an angle formed between the first and second housings 10 and 20.

At least a portion of the flexible display 40 may have flexibility. For example, the flexible display 40 may include a first rigid region 41 supported by the first housing 10 and a second rigid region 42 supported by the second housing 20, and a flexible third region 43 provided between the first region 41 and the second region 42.

The first region 41 and the second region 42 may be formed in a plane shape, and the third region 43 may be formed in a plane or curved shape to be deformable according to a state (e.g., a folded state or an unfolded state) of the electronic apparatus 1.

The flexible display 40 may be foldable based on the third region 43 and may display various contents (e.g., text, image, video, icon and symbol, etc.) to the user. The flexible display 40 may include, for example, a liquid crystal display (LCD), a light-emitting diode (LED) display, an organic light-emitting diode (OLED) display, a microelectromechanical systems (MEMS) displays, electronic paper displays, or the like.

In addition, the flexible display 40 may include a touch screen panel, and may sense a touch event from the outside.

Referring to FIG. 2, the first housing 10 may include a first front housing 11 on which the first region 41 of the flexible display 40 is positioned, a first rear housing 12 for accommodating a first circuit 51 built in an inner space of the first housing 10, and a first rear cover 13 for covering the first rear housing 12. Similarly, the second housing 20 may include a second front housing 21 on which the second region 42 of the flexible display 40 is positioned a second rear housing 12 for accommodating a second circuit 52 built in an inner space of the second housing 20, and a second rear cover 23 for covering the second rear housing 22.

The hinge structure 30 may be provided between the first housing 10 and the second housing 20 and may connect the first housing 10 and the second housing 20 to be rotated.

A cable member 200 may electrically connect the first circuit 51 accommodated in the first housing 10 and the second circuit 52 accommodated in the second housing 20 via the inside of the hinge structure 30.

An elastic member 100 may be provided in a passage formed in the housings 10 and 20 to introduce the cable member 200 into the housings 10 and 20, and may be penetrated by the cable member 200.

Specific structures of the cable member 200 and the elastic member 100 will be described in detail with reference to the drawings below.

Figure 3:
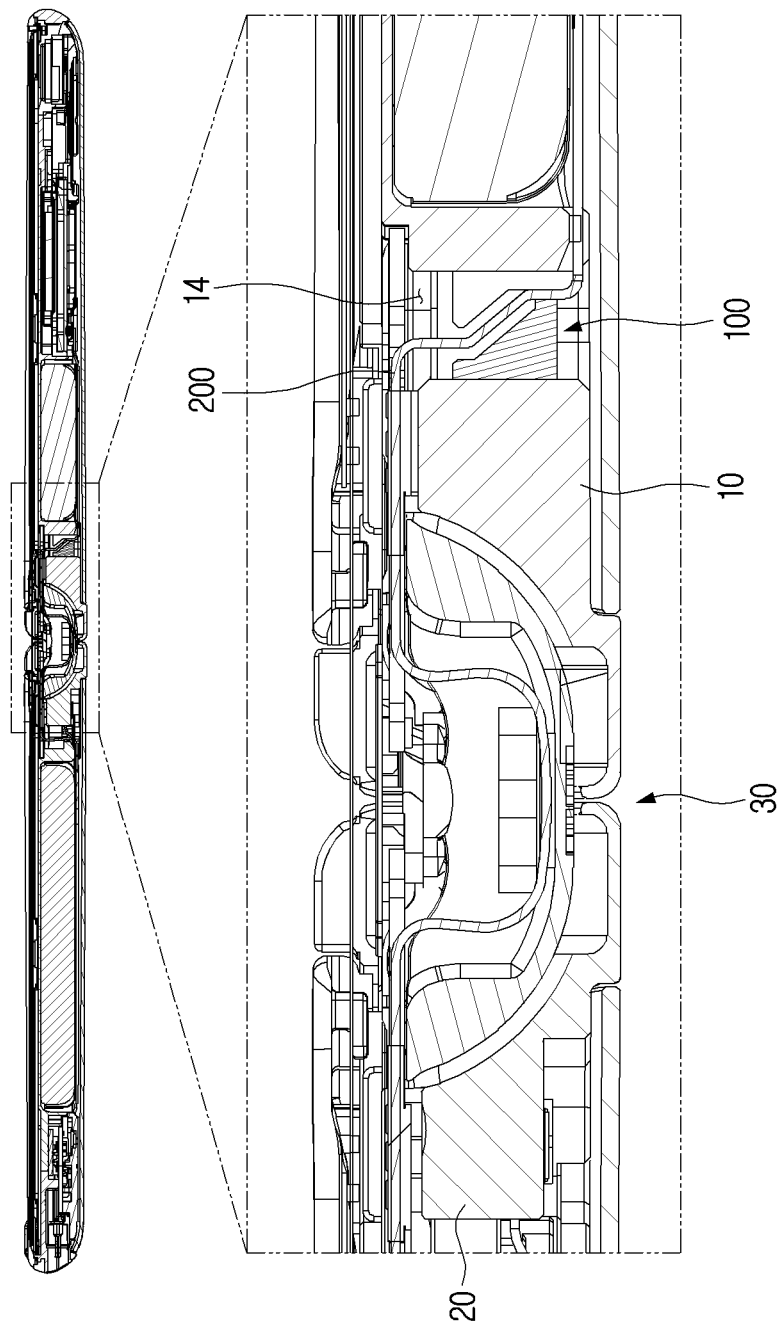
FIG. 3 is a cross-sectional view taken along line A-A of FIG. 1 and an enlarged view of a region in which a hinge structure and a passage member are provided.
Figure 4:
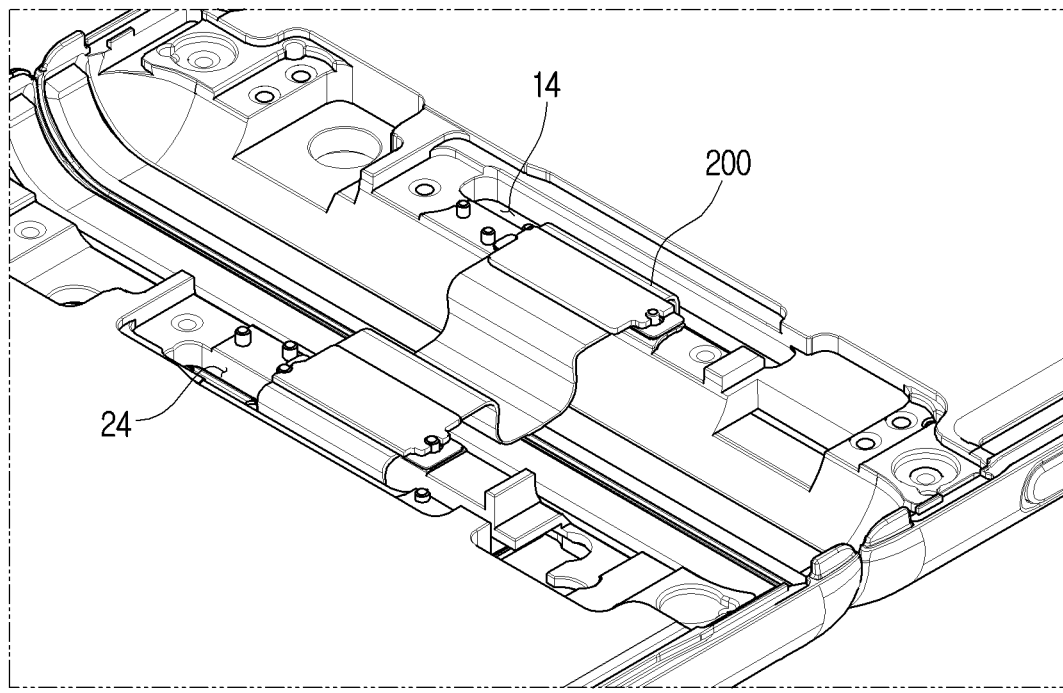
FIG. 4 is a view illustrating a structure in which a cable member is retracted into a housing through a passage member according to an example embodiment.

FIG. 3 is a cross-sectional view taken along line A-A of FIG. 1 and an enlarged view of a region in which a hinge structure and a passage member are provided, and FIG. 4 is a view illustrating a structure in which a cable member is retracted into a housing through a passage member according to an example embodiment.

Referring to FIGS. 3 and 4, the first and second housings 10 and 20 may include passage members forming passages 14 and 24 through which the cable member 200 is retracted into the housings 10 and 20, respectively. The cable member 200 may sequentially pass through a first passage member formed in the first housing 10, the hinge structure 30, and a second passage member formed in the second housing 20, and connect the first circuit 51 accommodated in the first housing 10 and the second circuit 52 accommodated in the second housing 20.

The elastic member 100 may be provided inside the passages 14 and 24 to seal a space between the cable member 200 and the passage member passing through the passages 14 and 24. Accordingly, it may prevent foreign substances from flowing into the housings 10 and 20 through the passages 14 and 24 formed to introduce the cable member 200 into the housings 10 and 20. The elastic member 100 may be provided on at least one of the first passage member formed in the first housing 10 and the second passage member formed in the second housing 20. For example, the elastic member 100 may be provided only in one of the first passage member and the second passage member, or may be provided in each of the first passage member and the second passage member.

Figure 5:
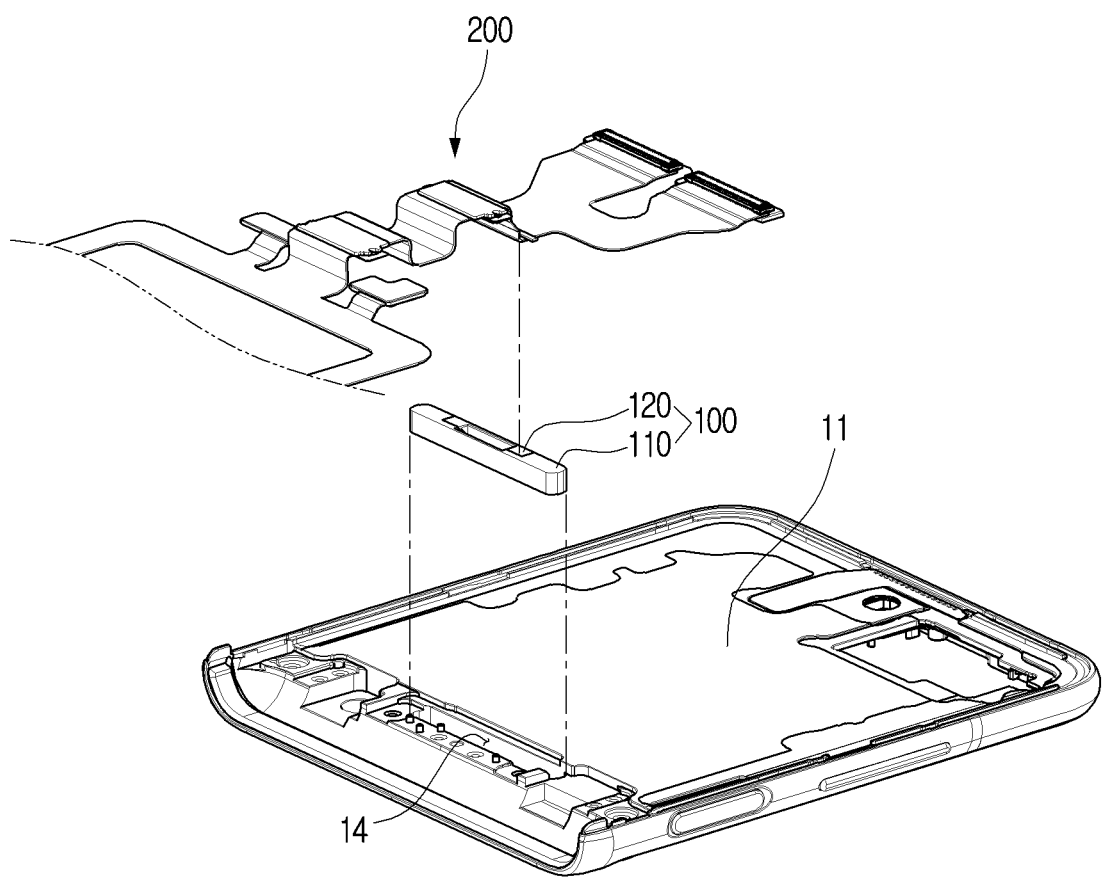
FIG. 5 is a view illustrating an elastic member provided inside a passage member and surrounding the cable member.
Figure 6:
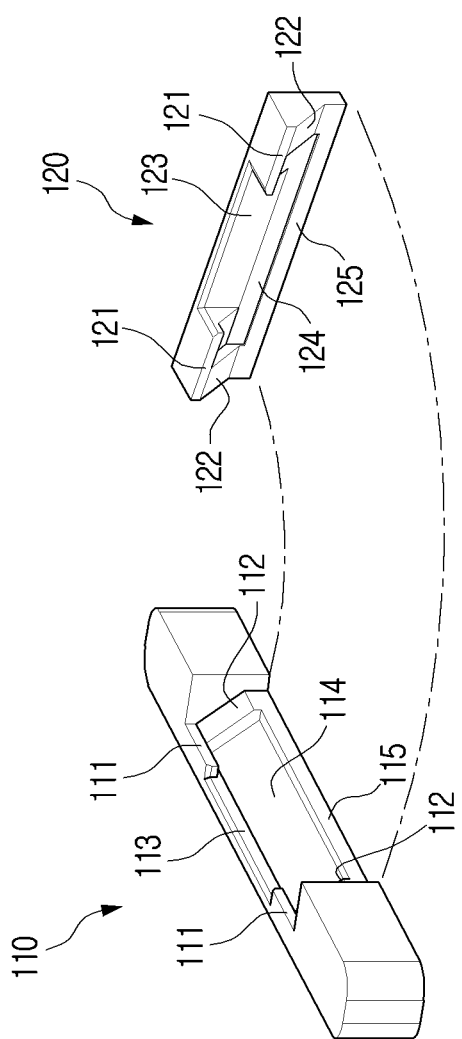
FIG. 6 is a view illustrating an example of a structure of a first elastic member and a second elastic member constituting an elastic member.

FIG. 5 is a view illustrating an elastic member provided inside a passage member and surrounding the cable member, and FIG. 6 is a view illustrating an example of a structure of a first elastic member and a second elastic member constituting an elastic member.

Referring to FIGS. 5 and 6, the elastic member 100 may include a first elastic member 110 and a second elastic member 120. The elastic member 100 may include a hollow region through which the cable member 200 may be provided, and the hollow region may be formed by providing a first groove 114 formed in the first elastic member 110 and a second groove 124 formed in the second elastic member 120 to face each other.

The first elastic member 110 and the second elastic member 120 may be provided on both sides with the cable member 200 interposed therebetween, and press the cable member 200 to fix the cable member 200 inside the passage 14.

Referring to FIG. 6, the first elastic member 110 may include a first protruding region 111 protruding toward the cable member 200 provided between the first elastic member 110 and the second elastic member 120. In addition, the second elastic member 120 may include a second protruding region 121 protruding toward the cable member 200 at a position corresponding to the first protruding region 111. One region of the cable member 200 may be fixed by being pressed by the first and second protruding regions 111 and 121.

The first and second elastic members 110 and 120 may be formed of a rubber, a polymer, a flexible plastic material, or a combination thereof. A width of the elastic member 100 may be formed to correspond to a width of the passage 14 formed through the passage member. For example, the width of the elastic member 100 may be formed to have a greater width than the passage 14, and may be fixed by being fitted in the passage 14 by elasticity.

The first elastic member 110 and the second elastic member 120 may include upper support surfaces 112 and 122 and lower support surfaces 115 and 125, respectively, capable of fixing the cable member 200 provided in a center by being pressed against each other. In addition, the first and second elastic members 110 and 120 may include injection holes 113 and 123 for introducing a bonding agent into the hollow region, respectively. A detailed description related thereto will be described below with reference to the accompanying drawings.

Figure 7:
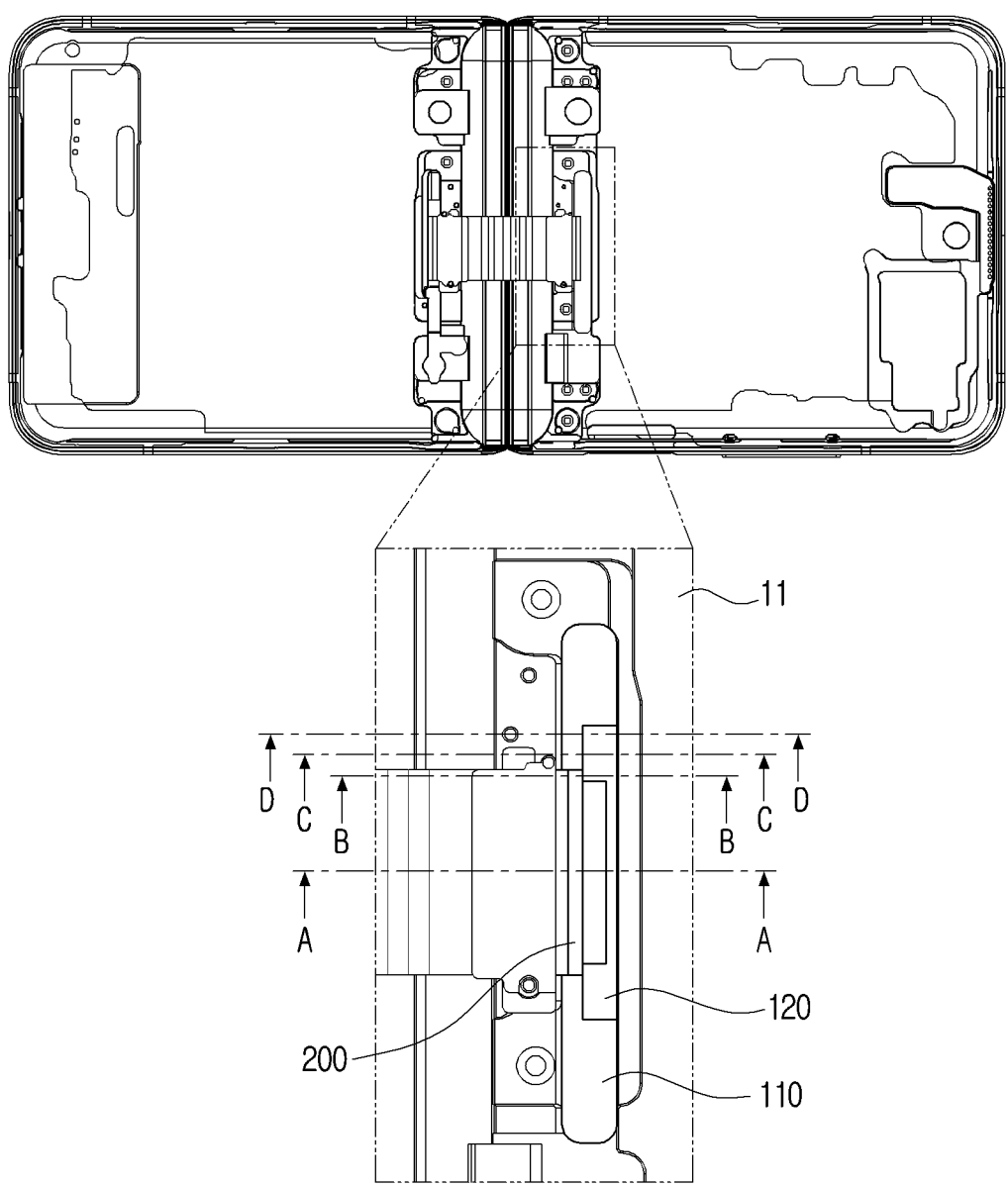
FIG. 7 is a top view illustrating a state in which an elastic member is provided inside a passage member, and is an enlarged view of a part of the top view.
Figure 8:
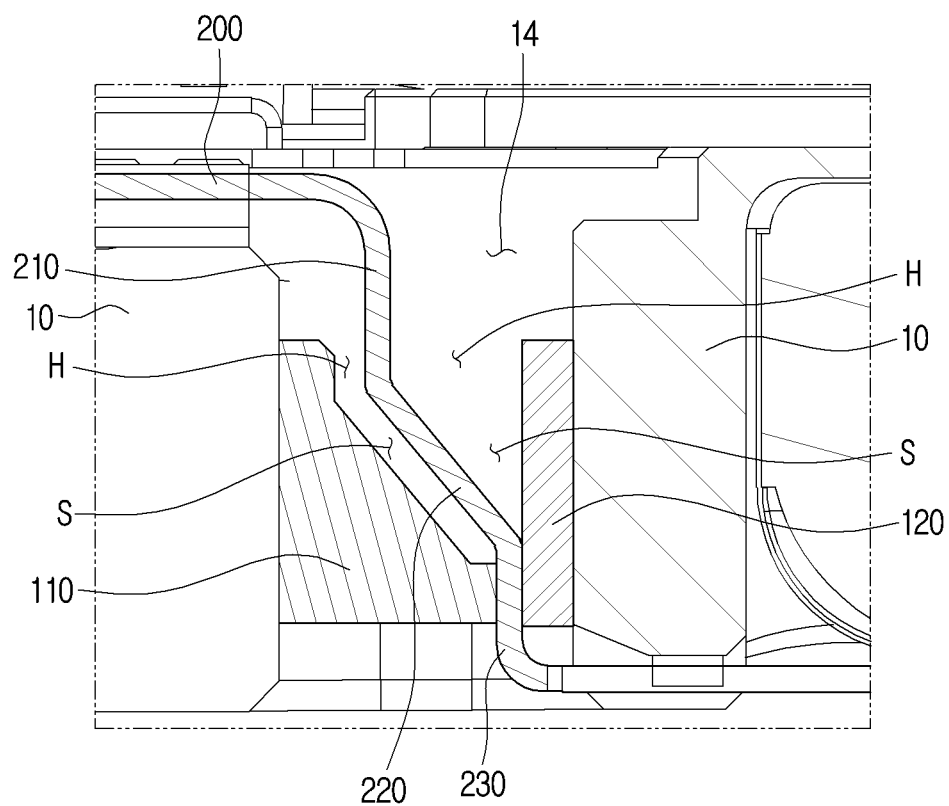
FIG. 8 is a cross-sectional view taken along line A-A of FIG. 7.

FIG. 7 is a top view illustrating a state in which an elastic member is provided inside a passage member, and is an enlarged view of a part of the top view. FIG. 8 is a cross-sectional view taken along line A-A of FIG. 7, and FIG. 9 is a cross-sectional view illustrating a state in which a bonding member is formed in FIG. 8.

Referring to FIG. 8, the first elastic member 110 and the second elastic member 120 may form a hollow region S therebetween, and the cable member 200 may pass through the hollow region S and may be retracted into the first housing 10.

An injection hole H may be formed in upper portions of the first elastic member 110 and the second elastic member 120, respectively, and the injection hole H may communicate with the hollow region S formed by the first and second elastic members 110 and 120. A bonding member 130 filling the hollow region S may be formed by injecting the bonding agent through the injection hole H.

Figure 9:
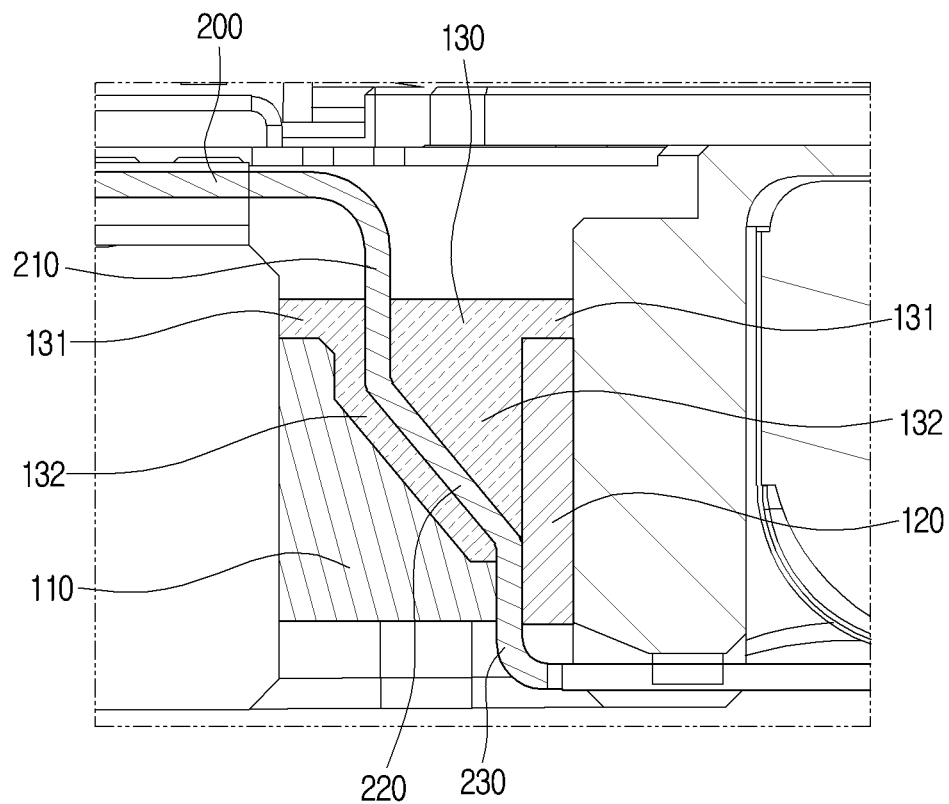
FIG. 9 is a cross-sectional view illustrating a state in which a bonding member is formed in FIG. 8.

Referring to FIG. 9, the bonding member 130 may be configured to fill between the cable member 200 and the first and second elastic members 110 and 120 in the hollow region S. The bonding member 130 may be formed by injecting a bonding agent into the hollow region S and curing the bonding agent.

The bonding member 130 may cover upper surfaces of the first and second elastic members 110 and 120, and include an upper region 131 filling a space between the cable member 200 and an inner wall of the passage member on which the first and second elastic members 110 and 120 are provided, and a lower region 132 filling the hollow region S. Accordingly, a clearance between the first elastic member 110, the second elastic member 120, the cable member 200, and the passage member forming the passage 14 may be sealed Meanwhile, the cable member 200 may include a first region 210 retracted into the passage member from the hinge structure 30, a second region 220 provided in the hollow region S of the elastic member 100, and a third region 230 retracted into the housing.

The second region 220 may be formed to be bent at a boundary between the first region 210 and the third region 230. For example, the first region 210 and the third region 230 may be horizontally provided with respect to an inner wall of the passage member, respectively, and may be formed to be vertically bent at a point retracted into the hinge structure 30 or the housing 10, respectively. The second region 220 may connect an end of the first region 210 and an end of the third region 230, and may have an inclination with respect to the inner wall of the passage member.

Meanwhile, the first groove formed in the first elastic member 110 and the second groove formed in the second elastic member 120 may be formed to correspond to an inclined shape of the second region 220. In other words, the hollow region S formed by the grooves of the first and second elastic members 110 and 120 may have an inclined shape to correspond to the second region 220 of the cable member 200.

Figure 10:
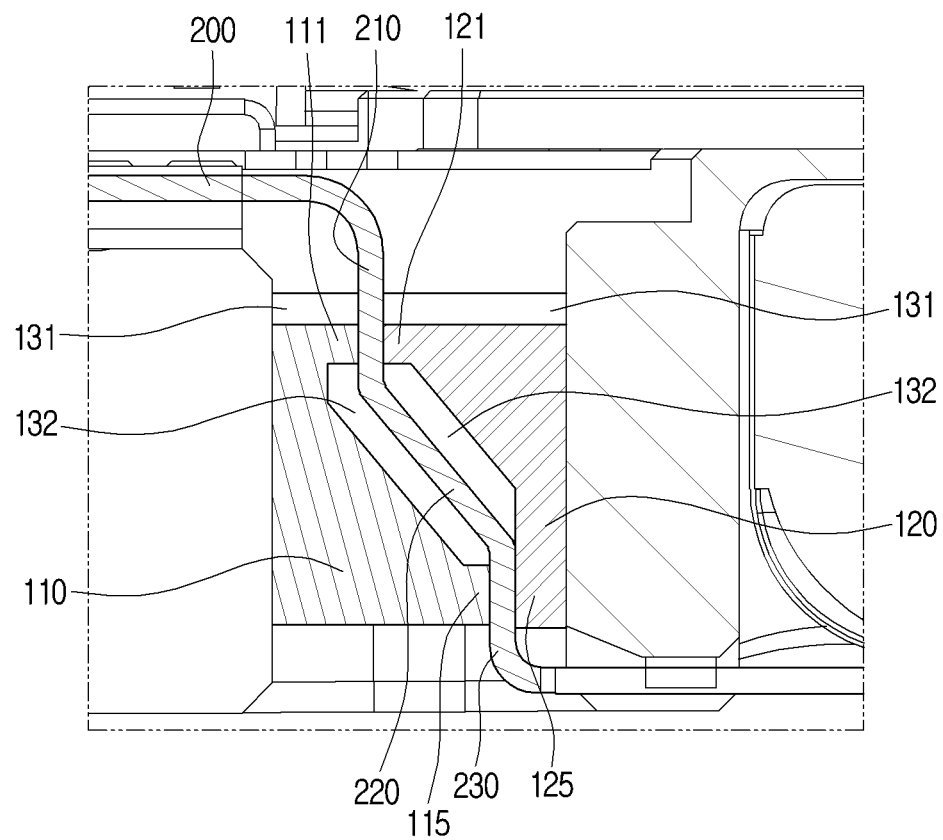
FIG. 10 is a cross-sectional view taken along line B-B of FIG. 7 in a state in which a bonding member is formed.

Referring to FIG. 10, which is a cross-sectional view taken along line B-B of FIG. 7 in a state in which a bonding member 130 is formed, the lower region 132 of the bonding member 130 filled in the hollow region S may be formed to surround the second region 220 of the cable member 200, and may be formed to correspond to the inclined shape of the second region 220.

Meanwhile, referring to FIG. 10, a portion of the first region 210 of the cable member 200 may be pressed and fixed by a first protrusion region 111 of the first elastic member 110 and a second protrusion region 121 of the second elastic member 120. In addition, the first and second elastic members 110 and 120 may include lower support surfaces 115 and 125 in contact with the third region 230 of the cable member 200, and a portion of the third region 230 may be fixed by being pressed by the lower support surfaces 115 and 125 of the first and second elastic members 110 and 120.

Referring to FIG. 10, the bonding member 130 may cover upper surfaces of the first and second elastic members 110 and 120, and include an upper region 131 filling a space between the cable member 200 and an inner wall of the passage member on which the first and second elastic members 110 and 120 are provided, and a lower region 132 filling the hollow region S. Accordingly, a clearance between the first elastic member 110, the second elastic member 120, the cable member 200, and the passage member forming the passage 14 may be sealed In addition, it may alleviate a shock applied to the cable member 200, and improve a durability of the elastic member 100 by absorbing the shock applied to the elastic member 100 according to a movement of the cable member 200.

Figure 11:
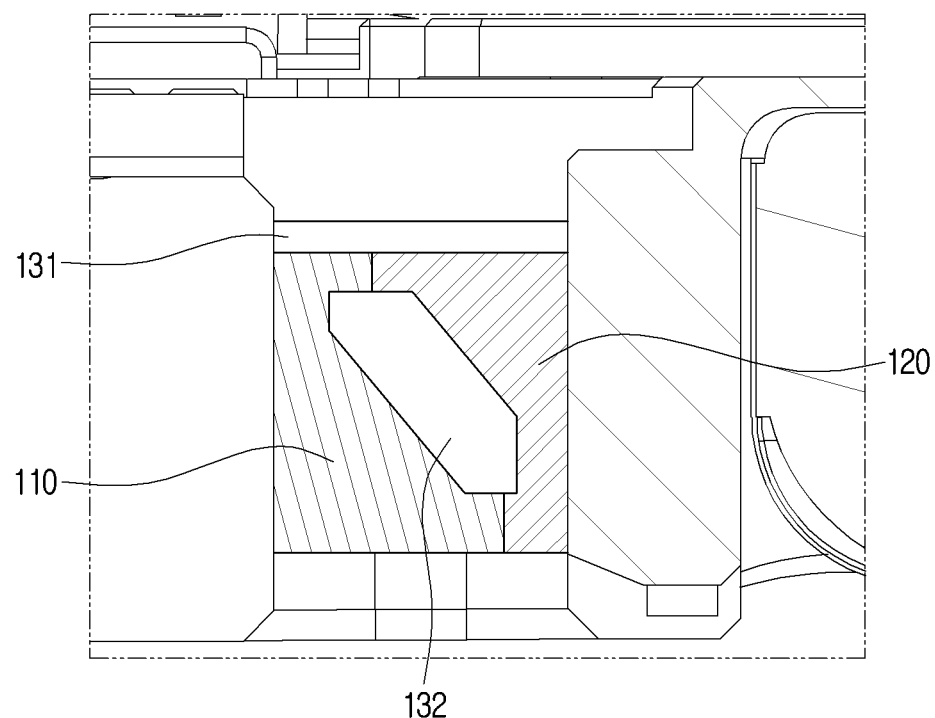
FIG. 11 is a cross-sectional view taken along line C-C of FIG. 7 in a state in which a bonding member is formed.
Figure 12:
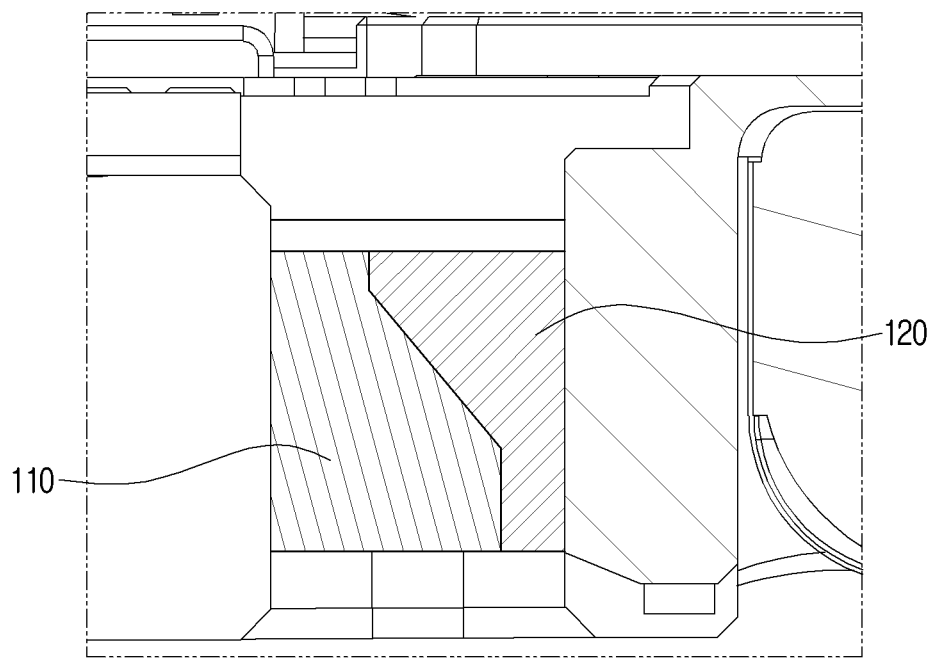
FIG. 12 is a cross-sectional view taken along line D-D of FIG. 7 in a state in which a bonding member is formed.

FIG. 11 is a cross-sectional view taken along line C-C of FIG. 7 in a state in which a bonding member is formed, and FIG. 12 is a cross-sectional view taken along line D-D of FIG. 7 in a state in which a bonding member is formed. Referring to FIG. 11, a hollow region through which the cable member 200 does not pass may be formed in the first and second elastic members 110 and 120, and the corresponding region may be filled by the lower region 132 of the bonding member 130. Also, referring to FIG. 12, both ends of the first and second elastic members 110 and 120 may be formed to be in close contact with each other. Accordingly, when a bonding agent is injected into the hollow region S to form the bonding member 130, it may prevent the bonding agent from flowing out of the elastic member 100.

Figure 13:
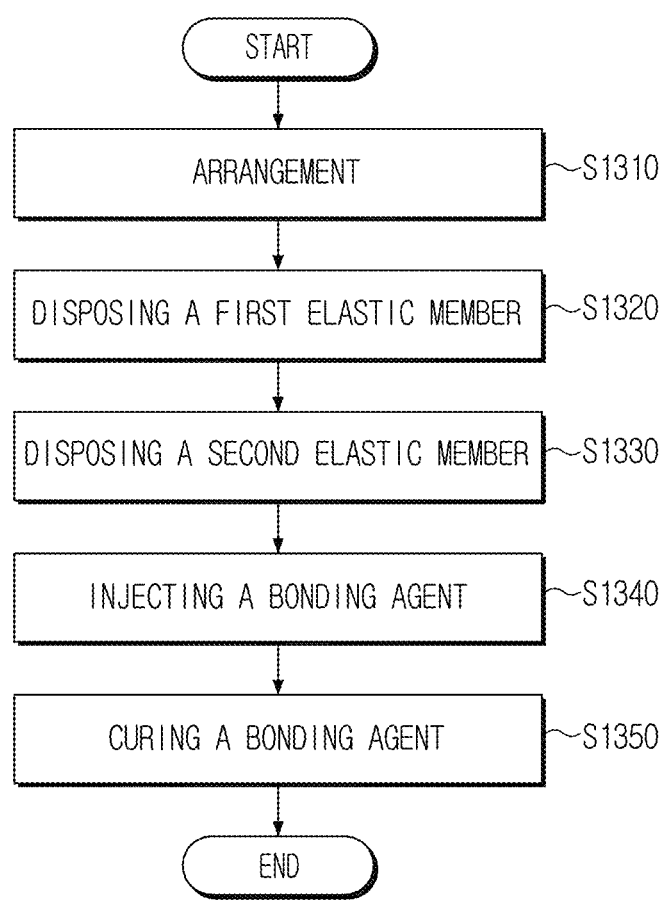
FIG. 13 is a flowchart illustrating a method of manufacturing an electronic apparatus according to an embodiment.

FIG. 13 is a flowchart illustrating a method of manufacturing an electronic apparatus according to an example embodiment.

Referring to FIG. 13, a method of manufacturing an electronic apparatus may include arranging a cable member to pass through a passage member included in a housing (S1310), disposing a first elastic member between one surface of the cable member and an inner wall of the passage member facing thereof (S1320), disposing a second elastic member between the other surface of the cable member and the inner wall of the passage member facing thereof (S1330), injecting a bonding agent into a hollow region formed by a first groove of the first elastic member and a second groove of the second elastic member (S1340) and curing the bonding agent (S1350). The cable member may be arranged to pass through the passage member included in the housing (S1310).

The first elastic member may be provided between one surface of the cable member and the inner wall of the passage member facing thereof (S1320), and the second elastic member may be provided between the other surface of the cable member and the inner wall of the passage member facing thereof (S1330).

In that configuration, the first and second elastic members may be provided such that a first groove of the first elastic member and a second groove of the second elastic member face each other to form a hollow region.

Meanwhile, a first protruding region of the first elastic member protruding toward the cable member and a second protruding region of the second elastic member protruding toward the cable member at a position corresponding to the first protruding region may arrange the first and second elastic members to be fixed by pressing one region of the cable member.

In addition, the bonding agent may be injected into the hollow region formed by the first groove of the first elastic member and the second groove of the second elastic member (S1340).

In that configuration, the method may further include applying a bonding agent to cover upper surfaces of the first and second elastic members and to fill a space between the inner wall of the cable member and the passage member.

Meanwhile, the bonding agent may be injected into the hollow region through an injection hole formed on the upper surface of the first and second elastic members.

The bonding agent may be cured (S1350). In that configuration, the method may further include at least one of applying heat to the injected bonding agent, irradiating ultraviolet rays, and applying pressure.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. An electronic apparatus comprising:
a first housing configured to accommodate a first circuit, the first housing comprising a first passage member configured to retract a cable member into the first housing;
a second housing configured to accommodate a second circuit, the second housing comprising a second passage member configured to retract the cable member into the second housing;
a hinge structure provided between the first housing and the second housing and configured to rotatably connect the first housing and the second housing;
a flexible display supported by the first housing and the second housing; and
the cable member configured to electrically connect the first circuit and the second circuit via the first passage member, the hinge structure, and the second passage member in sequence,
wherein at least one of the first passage member or the second passage member comprises:
an elastic member comprising a first elastic member and second elastic member, the cable member provided in a region between the first elastic member and the second elastic member; and
a bonding member filled between the cable member and the elastic member in the region, the bonding member formed as a one-piece structure surrounding the cable member, and comprising a first bonding portion contacting the first elastic member and the cable member and the second bonding portion contacting the second elastic member and the cable member.

2. The apparatus of claim 1,
wherein the elastic member comprises:
a first elastic member having a first groove; and
a second elastic member having a second groove.

3. The apparatus of claim 1,
wherein the bonding member comprises:
an upper region covering an upper surface of the elastic member and filling a space between an inner wall of the passage member on which the elastic member is provided and the cable member; and
a lower region filling the region.

4. The apparatus of claim 2,
wherein the first elastic member comprises a first protruding region protruding toward the cable member,
wherein the second elastic member comprises a second protruding region protruding toward the cable member at a position corresponding to the first protruding region, and
wherein the first protruding region and second protruding region are configured to press and fix a region of the cable member.

5. The apparatus of claim 4,
wherein the cable member comprises:

a first region retracted into the first or second passage member from the hinge structure;
a second region passing through the region of the elastic member; and
a third region retracted into the first or second housing,
wherein the second region is configured to be formed to be bent at a boundary with the first and third regions, respectively.

6. The apparatus of claim 5,
wherein the second region has an incline shape with respect to the inner wall of the first passage member or second passage member, and
wherein the first groove and the second groove are configured to be formed to correspond to the inclined shape of the second region.

7. The apparatus of claim 5,
wherein the first and second protruding regions are further configured to press and fix a portion of the first region.

8. The apparatus of claim 5,
wherein the first and second elastic members comprise a lower support surface in contact with the third region of the cable member, and
wherein the first and second elastic members are further configured to press and fix a portion of the third region.

9. The apparatus of claim 1,
wherein the elastic member is configured to be provided on the first passage member and the second passage member, respectively.

10. An electronic apparatus comprising:
a first housing configured to accommodate a first circuit;
a first passage member configured to receive a cable member;
a second housing configured to accommodate a second circuit;
a second passage member configured to receive the cable member;
a hinge structure provided between the first housing and the second housing and configured to rotatably connect the first housing and the second housing;
wherein at least one of the first passage member or the second passage member comprises:
an elastic member comprising a first elastic member and second elastic member, the cable member provided in a region between the first elastic member and the second elastic member; and
a bonding member filled between the cable member and the elastic member in the region, the bonding member formed as a one-piece structure surrounding the cable member, and comprising a first bonding portion contacting the first elastic member and the cable member and the second bonding portion contacting the second elastic member and the cable member.

11. The apparatus of claim 1, wherein the bonding member is provided above an uppermost portion of the elastic member.

12. The apparatus of claim 1, wherein the bonding member fills a space between an inner wall of the passage member and the cable member above an upper surface of the elastic member.

13. The electronic apparatus of claim 10, wherein the bonding member is provided above an upper surface of the elastic member.

14. The electronic apparatus of claim 10, wherein the bonding member fills a space between an inner wall of the passage member and the cable member above an upper surface of the elastic member.

\* \* \* \* \*